(12) United States Patent
Whig et al.

(10) Patent No.: US 10,141,498 B2
(45) Date of Patent: Nov. 27, 2018

(54) MAGNETORESISTIVE STACK, SEED REGION THEREOF AND METHOD OF MANUFACTURING SAME

(71) Applicant: Everspin Technologies, Inc., Chandler, AZ (US)

(72) Inventors: Renu Whig, Chandler, AZ (US); Jon M. Slaughter, Chandler, AZ (US); Han-Jong Chia, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/373,880

(22) Filed: Dec. 9, 2016

(65) Prior Publication Data

US 2017/0170388 A1 Jun. 15, 2017

Related U.S. Application Data

(60) Provisional application No. 62/265,650, filed on Dec. 10, 2015.

(51) Int. Cl.
| | | |
|---|---|---|
| *H01L 29/82* | (2006.01) | |
| *H01L 43/02* | (2006.01) | |
| *H01L 43/08* | (2006.01) | |
| *H01L 43/10* | (2006.01) | |
| *H01L 43/12* | (2006.01) | |

(52) U.S. Cl.
CPC ............. *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; G11C 11/161
USPC .............................................. 257/421; 438/3
See application file for complete search history.

(56) References Cited

U.S. PATENT DOCUMENTS

| | | |
|---|---|---|
| 5,768,181 A | 6/1998 | Zhu et al. |
| 5,801,984 A | 9/1998 | Parkin |
| 6,122,150 A | 9/2000 | Gill |

(Continued)

FOREIGN PATENT DOCUMENTS

JP 2000332317 11/2000

OTHER PUBLICATIONS

Ikeda et al., "A perpendicular-anisotropy CoFeB—MgO magnetic tunnel junction," *Nature Materials Letters*, vol. 9, pp. 721-724 (Sep. 2010).

(Continued)

*Primary Examiner* — Thao X Le
*Assistant Examiner* — Nduka Ojeh
(74) *Attorney, Agent, or Firm* — Bookoff McAndrews, PLLC

(57) ABSTRACT

A magnetoresistive stack/structure and method of manufacturing same comprising wherein the stack/structure includes a seed region, a fixed magnetic region disposed on and in contact with the seed region, a dielectric layer(s) disposed on the fixed magnetic region and a free magnetic region disposed on the dielectric layer(s). In one embodiment, the seed region comprises an alloy including nickel and chromium having (i) a thickness greater than or equal to 40 Angstroms (+/−10%) and less than or equal to 60 Angstroms (+/−10%), and (ii) a material composition or content of chromium within a range of 25-60 atomic percent (+/−10%) or 30-50 atomic percent (+/−10%).

29 Claims, 8 Drawing Sheets

(56) References Cited

U.S. PATENT DOCUMENTS

| | | |
|---|---|---|
| 6,291,087 B1 | 9/2001 | Xiao et al. |
| 6,469,926 B1 | 10/2002 | Chen |
| 6,544,801 B1 | 4/2003 | Slaughter et al. |
| 6,641,935 B1 | 11/2003 | Li et al. |
| 6,714,444 B2 | 3/2004 | Huai et al. |
| 6,731,477 B2 | 5/2004 | Lin et al. |
| 6,743,503 B1 | 6/2004 | Chen |
| 6,750,068 B2 | 6/2004 | Chen |
| 6,778,427 B2 | 8/2004 | Odagawa et al. |
| 6,831,312 B2 | 12/2004 | Slaughter et al. |
| 6,953,629 B2 | 10/2005 | Hintz et al. |
| 7,018,725 B2 | 3/2006 | Odagawa et al. |
| 7,067,331 B2 | 6/2006 | Slaughter et al. |
| 7,098,495 B2 | 8/2006 | Sun et al. |
| 7,241,631 B2 | 7/2007 | Huai et al. |
| 7,382,643 B2 | 6/2008 | Ashida et al. |
| 7,390,529 B2 | 6/2008 | Li et al. |
| 7,430,135 B2 | 9/2008 | Huai et al. |
| 7,528,457 B2 | 5/2009 | Horng et al. |
| 7,595,520 B2 | 9/2009 | Horng et al. |
| 7,605,437 B2 | 10/2009 | Mancoff et al. |
| 7,609,490 B2 | 10/2009 | Mizuno et al. |
| 7,672,093 B2 | 3/2010 | Horng et al. |
| 7,932,571 B2 | 4/2011 | Rizzo et al. |
| 8,565,013 B2 | 10/2013 | Bessho et al. |
| 8,686,484 B2 | 4/2014 | Whig et al. |
| 9,082,958 B2 | 7/2015 | Lu et al. |
| 9,099,124 B1 | 8/2015 | Freitag et al. |
| 9,159,906 B2 | 10/2015 | Whig et al. |
| 9,281,468 B2 | 3/2016 | Min et al. |
| 9,385,304 B2 | 7/2016 | Nakayama et al. |
| 9,419,208 B2 | 8/2016 | Whig et al. |
| 9,455,400 B2 | 9/2016 | Cao et al. |
| 9,793,319 B2 | 10/2017 | Gan et al. |
| 2004/0075960 A1 | 4/2004 | Li et al. |
| 2004/0091744 A1 | 5/2004 | Carey et al. |
| 2004/0145850 A1 | 7/2004 | Fukumoto et al. |
| 2004/0257719 A1 | 12/2004 | Ohba et al. |
| 2005/0219769 A1 | 10/2005 | Shimura et al. |
| 2006/0018057 A1 | 1/2006 | Huai |
| 2006/0098354 A1 | 5/2006 | Parkin |
| 2006/0114618 A1 | 6/2006 | Hosomi et al. |
| 2006/0141640 A1 | 6/2006 | Huai et al. |
| 2006/0180839 A1 | 8/2006 | Fukumoto et al. |
| 2006/0221680 A1 | 10/2006 | Hosotani |
| 2007/0076469 A1 | 4/2007 | Ashida et al. |
| 2007/0111332 A1 | 5/2007 | Zhao et al. |
| 2007/0228501 A1 | 10/2007 | Nakamura et al. |
| 2007/0278547 A1 | 12/2007 | Pietambaram et al. |
| 2008/0023740 A1 | 1/2008 | Horng et al. |
| 2008/0074805 A1 | 3/2008 | Ikarashi et al. |
| 2008/0179699 A1 | 7/2008 | Horng et al. |
| 2008/0182342 A1 | 7/2008 | Parkin |
| 2008/0299679 A1 | 12/2008 | Zhao et al. |
| 2009/0027810 A1 | 1/2009 | Horng et al. |
| 2009/0108383 A1 | 4/2009 | Horng et al. |
| 2010/0148167 A1 | 6/2010 | Whig et al. |
| 2010/0176470 A1 | 7/2010 | Horng et al. |
| 2010/0195380 A1 | 8/2010 | Wang et al. |
| 2010/0302690 A1 | 12/2010 | Worledge |
| 2010/0320550 A1 | 12/2010 | Abraham et al. |
| 2012/0028373 A1 | 2/2012 | Belen et al. |
| 2012/0286382 A1 | 11/2012 | Guenole et al. |
| 2012/0295132 A1 | 11/2012 | Min et al. |
| 2012/0299134 A1* | 11/2012 | Jan ............ H01L 43/08 257/421 |
| 2012/0313191 A1* | 12/2012 | Whig ............ H01L 43/08 257/421 |
| 2013/0175644 A1* | 7/2013 | Horng ............ H01L 43/12 257/421 |
| 2013/0270523 A1 | 10/2013 | Wang et al. |
| 2014/0021471 A1* | 1/2014 | Pietambaram ...... H01L 43/08 257/53 |
| 2014/0103469 A1* | 4/2014 | Jan ............ H01L 43/10 257/421 |
| 2014/0252518 A1* | 9/2014 | Zhang ............ H01L 43/12 257/422 |
| 2014/0306302 A1 | 10/2014 | Jan et al. |
| 2014/0319634 A1 | 10/2014 | Mikhailovich |
| 2015/0008550 A1 | 1/2015 | Min et al. |
| 2015/0129946 A1 | 5/2015 | Annunziata et al. |
| 2015/0171316 A1* | 6/2015 | Park ............ H01L 43/10 257/421 |
| 2016/0013401 A1 | 1/2016 | Whig et al. |

OTHER PUBLICATIONS

Worledge et al., "Spin torque switching of perpendicular Ta_CoFeB_MgO-based magnetic tunnel junctions," *Applied Physics Letters*, vol. 98, pp. 022501-1 to 022501-3 (2011).

International Search Report and Written Opinion of International Searching Authority, dated Feb. 17, 2017, 12 pages.

Nakamura et al., "Current-Induced Magnetization Switching in Two Types of Nanopillar with Dual Fixed Layers", Japanese J. of Applied Physics, vol. 45, No. 5A, pp. 3846-3849.

Fuchs et al., "Adjustable Spin Torque in Magnetic Tunnel Junctions with Two Fixed Layers", App. Physics Letters 85, 2005, pp. 152509-1 to 152509-3.

Berger, L., "Multilayer Configuration for Experiments of Spin Precession Induced by a DC Current", Journal of Applied Physics, vol. 93, No. 10, 2003, pp. 7693-7695.

\* cited by examiner

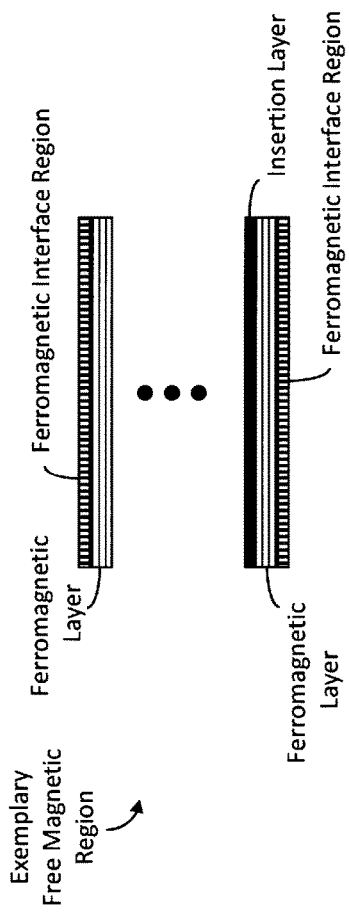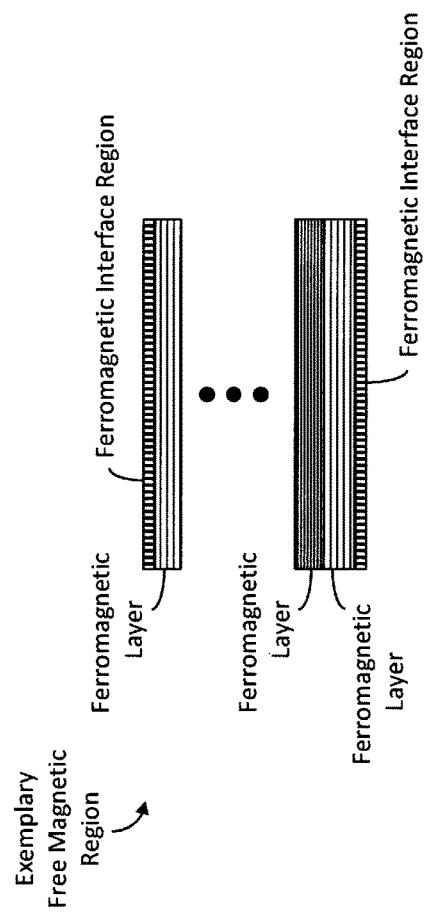

MAGNETORESISTIVE STACK, SEED REGION THEREOF AND METHOD OF MANUFACTURING SAME

RELATED APPLICATIONS

This non-provisional application claims priority to and the benefit of U.S. Provisional App. No. 62/265,650, entitled "Magnetoresistive Stack/Structure, Seed Region Therefor and Method of Manufacturing Same", filed Dec. 10, 2015. The '650 provisional application is incorporated herein by reference in its entirety.

INTRODUCTION

There are many inventions described and illustrated herein, as well as many aspects and embodiments of those inventions. In one aspect, the present inventions relate to a magnetoresistive stack/structure (for example, a magnetoresistive memory stack/structure or a magnetoresistive sensor/transducer stack/structure) and a method of manufacturing such a stack/structure. In one embodiment of this aspect of the invention, the inventive magnetoresistive stack/structure (for example, a magnetic tunnel junction (MTJ) stack/structure) includes a seed region having a material composition and an associated thickness, disposed between an electrically conductive material (for example, a metal of an electrode/via/line) and a region including one or more layers of magnetic or ferromagnetic materials, that improves the reliability, thermal stability and/or thermal endurance of the magnetoresistive stack/structure.

For example, the seed region may include one or more of nickel, chromium, cobalt, iron and alloys thereof (for example, an alloy including nickel and/or chromium) having a thickness which is greater than or equal to 30 Angstroms, or 40 Angstroms, or 50 Angstroms, or preferably greater than or equal to 60 Angstroms, or more preferably greater than or equal to 40 or 50 Angstroms and less than or equal to 100 Angstroms (for example, 40 Angstroms to 60 Angstroms), or even more preferably greater than or equal to 60 Angstroms and less than or equal to 100 Angstroms, or most preferably 60 Angstroms+/−10%. The seed region may be disposed between and in physical contact with an electrically conductive metal material of an electrode/via/line (for example, in the context of an electrode or via, tantalum, or an alloy thereof (such as a tantalum-nitride alloy), or a composite thereof (such as a tantalum and tantalum-nitride alloy composite)) and the fixed magnetic region a magnetoresistive memory stack/structure (which, in one embodiment, includes a plurality of layers of one or more magnetic or ferromagnetic materials (for example, a multi-layer structure of (i) cobalt and platinum or (ii) cobalt and nickel)).

In one embodiment, the seed region is implemented in a MTJ-type magnetoresistive stack/structure having a perpendicular magnetic anisotropy wherein the magnetic region disposed on or in physical contact with the seed region maintains or includes improved properties (for example, magnetoresistance (MR) and resistance-area product (RA) of the stack/structure) after subsequent or additional processing (for example, annealing processes after deposition/formation of the magnetic region). Indeed, a stack/structure including such a seed region may exhibit improved reliability, thermal stability and/or thermal endurance of the magnetoresistive stack/structure, for example, a magnetoresistive memory stack/structure. Here, the seed region of the present inventions may facilitate growth thereon of layers of the magnetic region that are smoother and/or include sharper interfaces (relative to layers grown on conventional seed regions). For example, a multi-layer magnetic region (e.g., (i) cobalt and platinum or (ii) cobalt and nickel) may be grown on the seed region of the present inventions more smoothly and with sharper interface. Further, the seed regions of the present inventions may include less stress (again relative to layers grown on conventional seed regions). One, some or all of these characteristics may facilitate an MTJ-type magnetoresistive stack/structure of the present inventions to include and/or maintain improved characteristics or properties (for example, magnetoresistance (MR) and resistance-area product (RA) of the stack/structure) even after being undergoing one or more anneal processes at elevated temperatures (for example, 400° C.).

Notably, the present inventions may employ any technique now known or later developed to manufacture the MTJ stack/structure including with respect to the formation and/or deposition of the seed region; all such techniques are intended to fall within the scope of the present inventions. For example, in one embodiment, the seed region is an alloy including nickel and chromium and is formed or deposited, via ion-beam deposition, sputtering and/or evaporation techniques, on an electrically conductive metal of, for example, an electrode/via/line (for example, a metal material such as tantalum or tantalum-nitride, or a composite thereof). Thereafter, one or more layers of ferromagnetic material (for example, a multi-layer structure of (i) cobalt and platinum or (ii) cobalt and nickel) may be deposited on the seed region. The multi-layer structure of cobalt and platinum may start with a cobalt layer (followed by a platinum layer) disposed on the nickel and chromium alloy seed layer/region. Where the multi-layer structure is cobalt and nickel, a nickel layer/region (followed by a cobalt layer) may be first disposed on the nickel and chromium alloy seed layer.

Briefly, a magnetoresistive memory stack/structure, in one embodiment, includes at least one non-magnetic layer (for example, at least one dielectric layer) disposed between a "fixed" magnetic region and a "free" magnetic region, each consisting of a plurality of layers of one or more magnetic or ferromagnetic materials. Information is stored in the magnetoresistive memory stack/structure by switching, programming and/or controlling the direction of magnetization vectors in one or more of the magnetic layers of the free magnetic region of the stack/structure. Here, the direction of the magnetization vectors of the free magnetic region may be switched and/or programmed (for example, through spin-torque transfer) by application of a write signal (one or more current pulses) to or through the magnetoresistive memory stack/structure while, in contrast, the magnetization vectors in the magnetic layers of a fixed magnetic region are magnetically fixed (in a predetermined direction).

The magnetoresistive memory stack/structure includes an electrical resistance that depends on the magnetic state of certain regions of the memory stack/structure. That is, in one embodiment, when the magnetization vectors of the "free" magnetic region are in a first state or in a first direction (for example, which is the same direction as the direction of the magnetization vectors of the "fixed" magnetic region), the magnetoresistive memory stack/structure has a first magnetic state which may correspond to a low electrical resistance state. Conversely, when the magnetization vectors of the "free" magnetic region are in a second state or in a second direction (for example, which is a different direction (for example, opposite or opposing) as the direction of the magnetization vectors of the "fixed" magnetic region), the magnetoresistive memory stack/structure has a second magnetic state which may correspond to a high electrical resistance state. The magnetic state of the magnetoresistive memory stack/structure is determined or read based on the resistance of the magnetoresistive memory stack/structure in response to a read current of a read operation.

As intimated above, the present inventions are directed to a magnetoresistive stack/structure—for example, a magnetoresistive memory stack/structure or a magnetoresistive sensor/transducer stack/structure having a seed region (which includes, for example, an alloy including nickel and chromium having a thickness (T) of T≥30 Angstroms+/−10%, or T≥0.40 Angstroms+/−10%, or T≥50 Angstroms+/−10%, or preferably T≥60 Angstroms+/−10%, or more preferably 100 Angstroms≥T≥40 or 50 Angstroms (each limit +/−10%) (for example, 60 Angstroms≥T≥40 Angstroms), or even more preferably 100 Angstroms≥T≥60 Angstroms (each limit +/−10%) (for example, T=80 Angstroms+/−10%), or most preferably T=60 Angstroms+/−10%), disposed between and in physical contact with an electrically conductive material such as metal of, for example, an electrode/via/line and a region having one or more layers of magnetic or ferromagnetic materials (for example, a fixed magnetic region of a magnetoresistive memory stack/structure). Further, the seed region may be substantially non-magnetic having a material composition or content including an alloy including nickel, iron, cobalt and/or chromium (for example, in one embodiment, an alloy including nickel and chromium wherein 25-60 atomic percent (+/−10%) or 30-50 atomic percent (+/−10%) is chromium, and preferably 40 atomic percent (+/−10%) is chromium).

The present inventions are also directed to magnetoresistive integrated circuit devices (for example, a spin-torque MRAM) having one or more magnetoresistive stacks/structures (for example, a plurality of MTJ stacks/structures of a MTJ-based sensor/transducer device and/or MTJ-based memory device). In one embodiment, the MTJ stacks/structures possess/include a perpendicular magnetic anisotropy wherein the magnetic region disposed on or in physical contact with the inventive seed region maintains or includes improved properties or characteristics (for example, magnetoresistance (MR) and resistance-area product (RA) of the stack/structure) after processing (for example, one or more annealing processes after deposition/formation of the magnetic region). Indeed, a magnetoresistive stack/structure including such a seed region may be more reliable and thermally stable and/or provide greater thermal endurance.

Notably, although certain exemplary embodiments are described and/or illustrated herein in the context of MTJ stacks/structures, the present inventions may be implemented in giant magnetoresistive (GMR) stacks/structures where a conductor is disposed between two ferromagnetic materials. Indeed, the present inventions may be employed in connection with other types of magnetoresistive stacks/structures wherein such stacks/structures include a seed region which is disposed between and in physical contact with an electrically conductive electrode/via/line and a region having one or more layers of magnetic or ferromagnetic materials. For the sake of brevity the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 4A illustrates a cross-sectional view of an exemplary free magnetic region wherein in one exemplary embodiment, the free magnetic region includes a plurality of ferromagnetic layers and one or more insertion layers (for example, having one or more non-ferromagnetic transition metals, such as tantalum, niobium, vanadium, zirconium, molybdenum or ruthenium and/or one or more alloys thereof); in one embodiment, the free magnetic region may include alternating ferromagnetic layers (for example, having cobalt, iron, boron, nickel and/or one or more alloys thereof such as a cobalt-iron alloy or a cobalt-iron-boron alloy) and insertion layers (for example, having one or more non-ferromagnetic transition metals, such as tantalum, niobium, vanadium, zirconium, molybdenum or ruthenium and/or one or more alloys thereof); notably, in one embodiment, the alternating ferromagnetic layer—insertion layer structure is disposed between ferromagnetic interface regions (for example, iron or an iron alloy) which interface with and/or contact the dielectric layer (i.e., tunnel barrier of the magnetoresistive stack/structure) and the spacer region (see FIG. 1A) or the first and second dielectric layers (see FIG. 1B);

FIG. 4B illustrates a cross-sectional view of an exemplary free magnetic region wherein in one exemplary embodiment, the free magnetic region includes a plurality of ferromagnetic materials and/or layers (for example, cobalt, iron, nickel and/or one or more alloys thereof such as a cobalt-iron alloy or a cobalt-iron-boron alloy); in this embodiment, the free magnetic region does not include one or more insertion layers in an alternating ferromagnetic layer—insertion layer structure (albeit, in one embodiment, not all insertion layers are omitted from the free magnetic region); notably, in this embodiment, the free magnetic region may also include ferromagnetic interface regions (for example, for example, iron or an iron alloy) which interface with and/or contact the dielectric layer (i.e., tunnel barrier of the magnetoresistive stack/structure) and the spacer region (see FIG. 1A) or the first and second dielectric layers (see FIG. 1B);

Figure 1A:
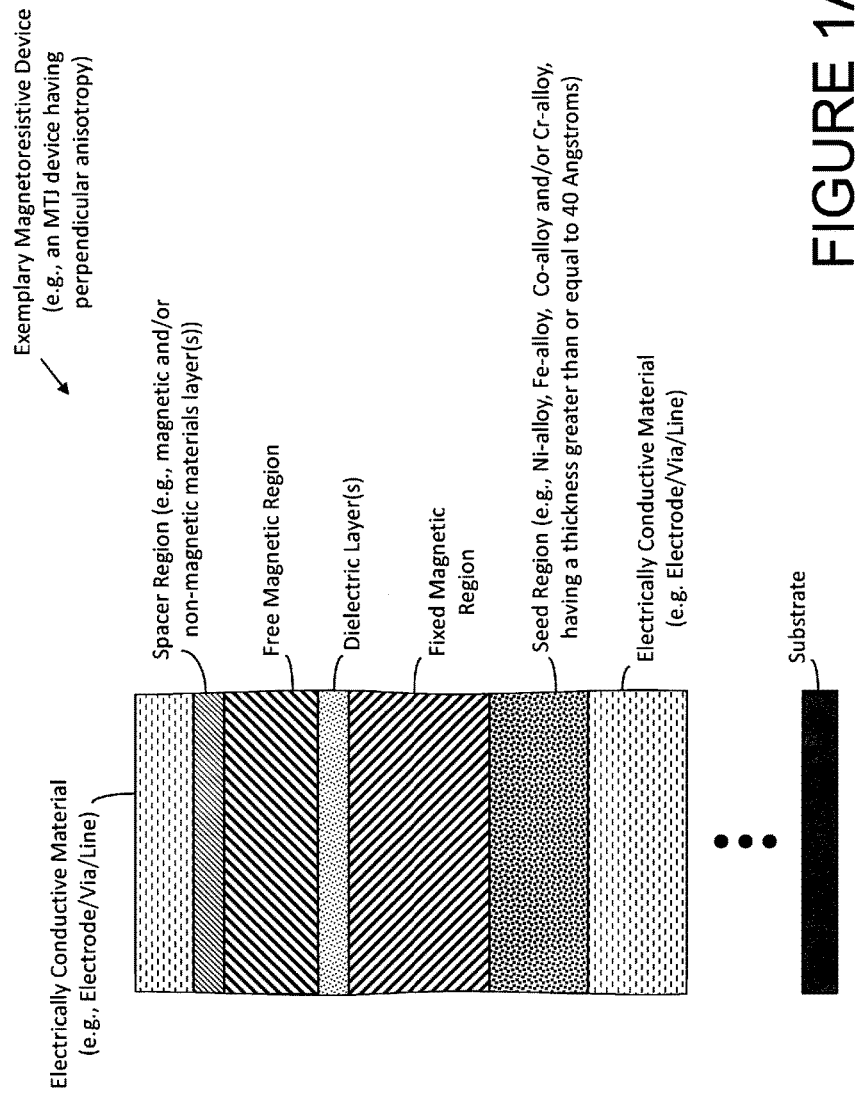
FIGS. 1A and 1B each illustrate a cross-sectional view of layers of an exemplary MTJ-type magnetoresistive stack/structure (for example, an in-plane or out-of-plane (e.g., perpendicular) magnetic anisotropy magnetoresistive stack/structure) including a dielectric layer disposed between a free magnetic region and a fixed magnetic region wherein, in this exemplary embodiment, the fixed magnetic region is disposed on the seed region according to certain aspects of certain embodiments of the present inventions wherein the seed region includes one or more of nickel, chromium, cobalt and iron and alloys thereof, for example, an alloy including nickel and/or chromium, having a thickness (T) of T≥30 Angstroms, T≥40 Angstroms, or T≥40 Angstroms, or preferably T≥60 Angstroms, or more preferably 100 Angstroms≥T≥40 or 50 Angstroms, or even more preferably 100 Angstroms≥T≥60 Angstroms (for example, T=80 Angstroms), or most preferably T=60 Angstroms (notably, each of the aforementioned values, limits or ranges may be +/−10%); in this exemplary embodiment, the MTJ-type magnetoresistive stack/structure is disposed between and in physical contact with electrically conductive electrodes/vias/lines (for example, in the context of an electrodes or vias, tantalum, or an alloy thereof (such as a tantalum-nitride alloy), or a composite thereof (such as a tantalum and tantalum-nitride alloy composite)); notably, the free magnetic region and the fixed magnetic region may each include a plurality of the layer(s) of magnetic or ferromagnetic material(s) (for example, materials that include one or more of the ferromagnetic elements nickel (Ni), iron (Fe), and cobalt (Co), including, for example, alloys or engineered materials with one or more of the elements palladium (Pd), platinum (Pt), magnesium (Mg), manganese (Mn), and chromium (Cr)) as well as one or more synthetic antiferromagnetic structures (SAF) or synthetic ferromagnetic structures (SyF) wherein one or more layers of magnetic materials layers may also include one or more non-magnetic materials layers (for example, ruthenium (Ru), copper (Cu), aluminum (Al), tantalum (Ta), titanium (Ti), niobium (Nb), vanadium (V), zirconium (Zr), iridium (Ir) and one or more alloys thereof, and in certain embodiments, tungsten (W) and molybdenum (Mo); moreover, the dielectric layers may be, for example, one or more layers of aluminum oxide and/or magnesium oxide.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

Moreover, many other aspects, inventions and embodiments, which may be different from and/or similar to, the aspects, inventions and embodiments illustrated in the drawings, will be apparent from the description, illustrations and claims, which follow. In addition, although various features and attributes have been illustrated in the drawings and/or are apparent in light thereof, it should be understood that such features and attributes, and advantages thereof, are not required whether in one, some or all of the embodiments of the present inventions and, indeed, need not be present in any of the embodiments of the present inventions Notably, for simplicity and clarity of illustration, certain aspects of the figures depict the general structure and/or manner of construction of the various embodiments. Descriptions and details of well-known features and techniques may be omitted to avoid unnecessarily obscuring other features. Elements in the figures are not necessarily drawn to scale; the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

DETAILED DESCRIPTION

The following Detailed Description is merely illustrative and is not intended to limit the embodiments of the subject matter or the application and uses of such embodiments. Any embodiment or implementation described herein as exemplary is not necessarily to be construed as preferred or advantageous over other implementations. Rather it is intended or used in the sense of an "example" rather than "ideal" or "preferred" or "advantageous" relative to other implementations or embodiments.

Further, the terms "comprise," "include," "have" and any variations thereof are used synonymously to denote or describe non-exclusive inclusion. As such, a process, method, article, or apparatus that uses such terms does not include only those steps, structure or elements but may include other steps, structures or elements not expressly listed or inherent to such process, method, article, or apparatus. In addition, the terms "first," "second," and the like, herein do not denote any order, quantity, or importance, but rather are used to distinguish an element, a structure, a step or a process from another. Moreover, the terms "a" and "an" herein do not denote a limitation of quantity, but rather denote the presence of at least one of the referenced item.

In one aspect, the present inventions relate to a magnetoresistive stack/structure (for example, a magnetoresistive memory stack/structure or a magnetoresistive sensor/transducer stack/structure) and a method of manufacturing such a stack/structure wherein the magnetoresistive stack/structure (for example, a magnetic tunnel junction (MTJ) stack/structure) includes a seed region having a material composition and an associated thickness that improves the reliability, thermal stability and/or thermal endurance of the magnetoresistive stack/structure. For example, the seed region may include one or more of nickel, chromium, cobalt, iron and alloys thereof (for example, an alloy including nickel and/or chromium) having a thickness which is greater than or equal to 30 Angstroms or 40 Angstroms or 50 Angstroms, preferably greater than or equal to 60 Angstroms and less than or equal to 100 Angstroms (for example, 80 Angstroms), or most preferably 60 Angstroms (notably, each of the aforementioned values, limits and/or ranges of the thickness of the seed region may be +/−10%), which is disposed between and in physical contact with an electrically conductive material (for example, a metal material of, for example, an electrode/via/line (for example, in the context of an electrode or via, tantalum, or an alloy thereof or a composite thereof and the fixed magnetic region a magnetoresistive memory stack/structure (which, in one embodiment, includes a plurality of layers of one or more magnetic or ferromagnetic materials (for example, a multi-layer structure of (i) cobalt and platinum or (ii) cobalt and nickel))).

In one embodiment, the seed region is implemented in a MTJ-type magnetoresistive stack/structure having a perpendicular magnetic anisotropy wherein the magnetic region, which is disposed on or in physical contact with the seed region, maintains or includes improved properties (for example, magnetoresistance (MR) and resistance-area product (RA) of the stack/structure) after subsequent or additional processing (for example, annealing processes at temperatures of 400° C.)). Indeed, a stack/structure including such a seed region may exhibit improved reliability, thermal stability and/or thermal endurance of the magnetoresistive stack/structure. Here, the seed region of the present inventions may facilitate growth thereon of layers of the magnetic region that are smoother and/or include sharper interfaces (relative to layers grown on conventional seed regions). For example, a multi-layer magnetic region (e.g., (i) cobalt and platinum or (ii) cobalt and nickel) may be grown on the seed region of the present inventions more smoothly and with sharper interface. Further, the seed regions of the present inventions may include less stress (again relative to layers grown on conventional seed regions). One, some or all of these characteristics may contribute to an MTJ-type magnetoresistive stack/structure exhibiting and/or maintaining improved characteristics or properties (for example, magnetoresistance (MR) and resistance-area product (RA) of the stack/structure) even after undergoing or being exposed to one or more processes (for example, one or more anneal processes) at elevated temperatures (for example, 400° C.).

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be employed/applied whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack/structure having one or more electrically conductive electrodes, vias or conductors on either side of a magnetic material stack. As described in further detail below, the magnetic material stack may include many different layers of material, where some of the layers include magnetic materials, whereas others do not. In one embodiment, the methods of manufacturing include sequentially depositing, growing, sputtering, evaporating and/or providing (as noted above, hereinafter collectively "depositing" or other verb tense (e.g., "deposit" or "deposited")) layers and regions which, after further processing (for example, etching) those layers form a magnetoresistive stack/structure.

The magnetoresistive structures/stacks of the present inventions may be formed between electrically conductive material of, for example, a top electrode/via/line and a bottom electrode/via/line, which permit access to the stack/structure by allowing for connectivity to circuitry and other elements of the magnetoresistive device. Between electrically conductive material of, for example, the electrodes/vias/lines, are layers and/or regions, including at least one fixed magnetic region (which includes, among other things, a plurality of ferromagnetic layers), a seed region, which in at least one embodiment is disposed between the electrically conductive electrode/via/line, at least one free magnetic region (which includes, among other things, a plurality of ferromagnetic layers), and one or more dielectric layers or regions (hereinafter collectively, "dielectric layer")—including at least one dielectric layer, disposed between a fixed magnetic region and the free magnetic region, to provide a tunnel barrier layer therebetween.

With reference to FIGS. 1A, 1B, 2A and 2B, the magnetoresistive structure/stack of a first aspect of the present inventions includes a seed region that is deposited on electrically conductive material of an electrode, via and/or conductor. In one embodiment, the material of the seed region includes one or more of nickel, chromium, cobalt, iron and alloys thereof. Here, the seed region may be deposited using a physical vapor deposition technique (for example, a sputtering technique (such as, an ion beam deposition or magnetron sputtering) and/or an evaporation technique. For example, the material of the seed region may be a nickel-chromium alloy which is ion beam sputtered on the material of the electrically conductive material (for example, a metal material of an electrode, via and/or conductor (for example, tantalum, or an alloy thereof (such as a tantalum-nitride alloy), or a composite thereof (such as a tantalum and tantalum-nitride alloy composite)). In one embodiment, the content of chromium is sufficient to render the seed region non-magnetic. For example, the nickel-chromium alloy may be greater than or equal to 25 or 30 atomic percent (+/−10%) chromium and less than or equal to 50 or 60 atomic percent (+/−10%) chromium and preferably, 40 atomic percent (+/−10%) chromium; notably, the balance of the nickel-chromium alloy, in one embodiment, consists of nickel.

With continued reference to FIGS. 1A, 1B, 2A and 2B, the thickness of the material (for example, nickel-chromium alloy) of the seed region, in one embodiment, is greater than or equal to 30, 40 or 50 Angstroms, or preferably greater than or equal to 60 Angstroms. In one embodiment, the thickness of the material of the seed region is greater than or equal to 40 Angstroms and less than or equal to 100 Angstroms (for example, greater than or equal to 40 Angstroms and less than or equal to 60 Angstroms), or preferably greater than or equal to 60 Angstroms and less than or equal to 100 Angstroms (for example, 80 Angstroms). In a most preferred embodiment, the thickness of the material (for example, a nickel-chromium alloy) of the seed region is 60 Angstroms. In the context of a nickel-chromium alloy, all combinations of the aforementioned thicknesses in conjunction with the aforementioned nickel and chromium atomic percentages are intended to fall within the scope of the present inventions (for example, Ni60Cr40 atomic percent having a thickness greater than or equal to 40 Angstroms and more preferably, (i) equal to 60 Angstroms or (ii) greater than or equal to 40 Angstroms and less than or equal to 60 Angstroms). Notably, each of the aforementioned values, limits and/or ranges of the thickness of the seed region may be +/−10%.

After deposition of the seed region, a fixed magnetic region is deposited. The fixed magnetic region may be a multi-layer, unpinned SAF including a plurality of layers of one or more magnetic or ferromagnetic materials (for example, a multi-layer structure of (i) cobalt and platinum (for example, each layer having a thickness of 5 Angstroms or less, preferably 4 Angstroms or less, and more preferably having a thickness of 3 Angstroms or less) or (ii) cobalt and nickel (for example, each layer having a thickness between 1 and 6 Angstroms, preferably 4 Angstroms or less, and more preferably 3 Angstroms or less)) separated by a coupling layer (for example, a coupling layer including ruthenium having a thickness of, for example, 4 Angstroms (+/−1 Angstrom)). (See, for example, FIGS. 3A and 3B).

The fixed magnetic region may be deposited or formed using any technique now known or later developed; all of which are intended to fall within the scope of the present inventions.

Notably, where the multi-layer SAF of the fixed magnetic region is cobalt and platinum an initial layer of ferromagnetic material of cobalt may be deposited on the seed region. Where the multi-layer SAF of the fixed magnetic region is cobalt and nickel, an initial layer of ferromagnetic material of nickel may be deposited on the seed region. Moreover, the multilayer SAF may include cobalt layers at both interfaces with the coupling layer.

Indeed, in one embodiment, the multilayer SAF of the fixed magnetic region possesses a perpendicular magnetic anisotropy. The seed region of the present inventions may facilitate growth, deposition or formation of an MTJ-based stack/structure having a perpendicular magnetic anisotropy with improved thermal endurance and properties notwithstanding subsequent or additional processing—including annealing processes of 400° C. Here, the seed region may facilitate growth, deposition or formation of smoother layers having a sharper interface. Such growth, deposition or formation may also provide less stress thereby assisting in the maintenance of high MR post processing at elevated temperatures (for example, 400° C.).

Figure 3A:
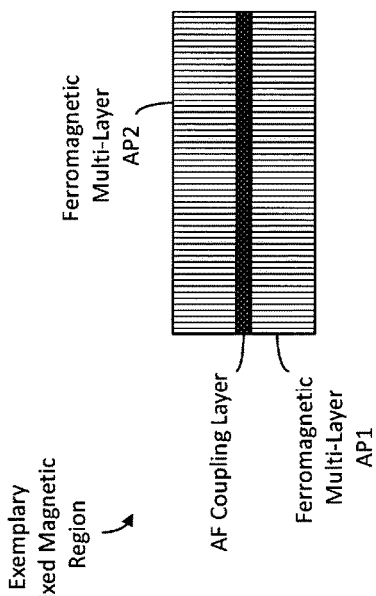
FIG. 3A illustrates a cross-sectional view of an exemplary fixed magnetic region wherein in one exemplary embodiment, the fixed magnetic region is a fixed, unpinned SAF including a first multi-layer structure (AP1) which is antiferromagnetically coupled to a second multi-layer structure (AP2) via the coupling layer wherein each multi-layer structure may include a plurality of layers of magnetic or ferromagnetic material(s) (for example, materials that include one or more of the ferromagnetic elements nickel (Ni), iron (Fe), and cobalt (Co), including alloys or engineered materials with one or more of the elements palladium (Pd), platinum (Pt), chromium (Cr) and alloys thereof); the coupling layer may include one or more non-magnetic materials (for example, ruthenium (Ru), iridium (Ir) or rhodium (Rh))
Figure 3B:
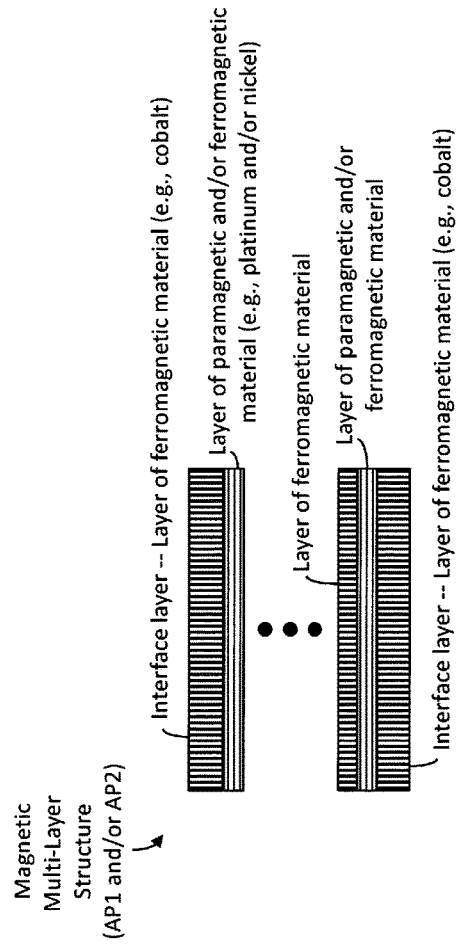
FIG. 3B illustrates a cross-sectional view of an exemplary magnetic multi-layer of a portion of a fixed, unpinned SAF region of, for example, a fixed magnetic region, having interface layers (for example, layers that are in contact or interface with the seed region, the coupling layer and/or the dielectric layer), according to certain embodiments of the present inventions; notably, the magnetic multi-layer structure may be employed as AP1 and/or AP2 of the fixed, unpinned SAF region (see, for example, FIG. 3A) of, for example, a fixed magnetic region; moreover, the magnetic multi-layer structure may include one or more insertion layers (for example, one or more non-ferromagnetic transition metals, such as tantalum (Ta), tungsten (W) and/or molybdenum (Mo))—albeit such insertion layer(s) is/are not illustrated.
Figure 3C:
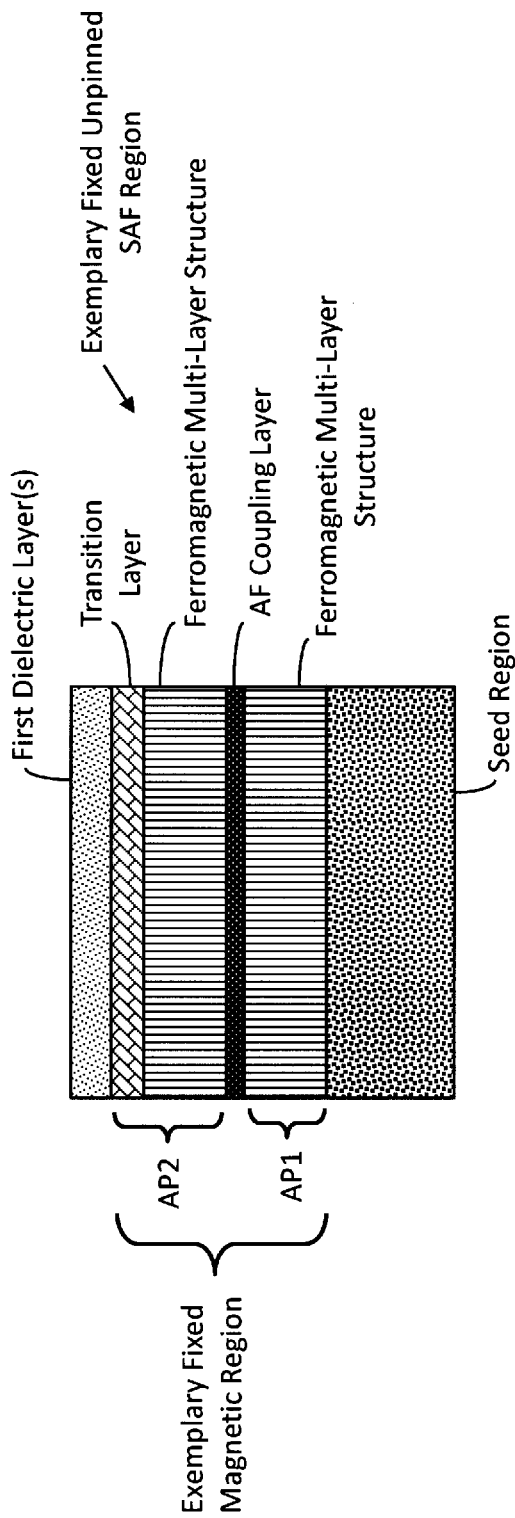
FIG. 3C illustrates a cross-sectional view of another exemplary fixed magnetic region including multi-layer structures (AP1 or AP2) and a transition layer and a reference layer disposed between AP2 and the dielectric layer, according to certain embodiments of the inventions, wherein the transition layer may include one or more layers of material that facilitate/improve growth of the dielectric layer (which is a tunnel barrier in the MTJ structure) during fabrication; in one embodiment, the reference layer may include one or more or all of cobalt, iron, boron and tantalum (for example, in an alloy—such as an amorphous alloy (e.g., CoFeB or CoFeBTa or CoFeTa) and the transition layer may include a non-ferromagnetic transition metal such as tantalum, titanium, tungsten and/or molybdenum; in another embodiment, the reference layer may include a layer of iron (for example, deposited as pure or substantially pure iron) and a layer of cobalt, iron and boron (for example, deposited as an alloy) wherein, after further/final processing (e.g., after annealing), the layer of iron at the interface may form a continuous atomic layer or may mix with the underlying ferromagnetic alloy in the final annealed structure, resulting in a high-iron interface region within the reference layer which is adjacent to the dielectric layer.

With reference to FIG. 3C, in another embodiment, the fixed magnetic region includes multi-layer structures (AP1 or AP2) and a transition layer and a reference layer disposed between AP2 and the dielectric layer. The transition layer may include one or more layers of material that facilitate/improve growth of a dielectric layer (which may be the tunnel barrier in the MTJ stack/structure) during fabrication. In one embodiment, the reference layer may include one or more or all of cobalt, iron, boron and tantalum (for example, in an alloy—such as an amorphous alloy (e.g., CoFeB or CoFeBTa or CoFeTa)) and the transition layer may include a non-ferromagnetic transition metal such as tantalum, titanium, tungsten and/or molybdenum. In yet another embodiment, the reference layer may include a layer of iron (for example, deposited as pure or substantially pure iron) and a layer of cobalt, iron and boron (for example, deposited as an alloy) wherein, after further/final processing (e.g., after annealing), the layer of iron at the interface may form a continuous atomic layer or may mix with the underlying ferromagnetic alloy in the final annealed structure, resulting in a high-iron alloy interface region (for example, an iron rich alloy (CoFe of CoFeX where X may be nickel and/or one or more non-magnetic materials such as one or more transition metals or boron)) within the reference layer which is adjacent to and/or in contact with the dielectric layer. In one embodiment, the high-iron alloy interface region is greater than or equal to 50% iron by atomic percentage).

With reference to FIGS. 1A, 1B, 2A and 2B, one or more dielectric layers may then be deposited on the fixed magnetic region using any technique now known or later developed. The one or more dielectric layers may be, for example, a magnesium-oxide or an aluminum-oxide. The one or more dielectric layers may provide the tunnel barrier region of the magnetoresistive stack/structure. In one embodiment, the one or more dielectric layers are fabricated or provided using the materials and processes described and illustrated in U.S. Pat. Nos. 8,686,484 and 9,136,464.

With continued reference to FIGS. 1A, 1B, 2A and 2B, a free magnetic region is then deposited on the one or more dielectric layers. Here, the free magnetic region may include a plurality of ferromagnetic material layers (for example, one or more of cobalt, iron, and nickel) as well as one or more non-magnetic material layers (for example, ruthenium, tantalum, aluminum). (See, for example, U.S. Pat. No. 8,686,484). The free magnetic region may include ferromagnetic interface regions. (See, for example, FIG. 4A). In one embodiment, the ferromagnetic interface regions include at least 50% iron by atomic percentage (hereinafter "high-iron interface regions"). (See, for example, U.S. Pat. No. 8,686,484). Notably, the high-iron interface regions may include a continuous layer of iron (for example, pure iron), a discontinuous layer of iron, and/or an interfacial layer of high-iron alloy (wherein the alloy includes greater than or equal to 50% iron by atomic percentage). In one embodiment, the high-iron interface region provides at least an atomic layer of material at the surface of the free magnetic region having mainly iron atoms. Notably, the high-iron interface regions may provide, among other things, high perpendicular interface anisotropy energy.

After deposition of the materials/layers of the free magnetic region, in one embodiment, a spacer region is deposited followed by an electrode/via/line. (See, FIG. 1A). In another embodiment, one or more second dielectric layers are deposited followed by a spacer region and an electrically conductive material (for example, a metal of an electrode/via/line). (See, FIG. 1B). The spacer region may be a non-magnetic region that provides a barrier between the free magnetic region and the electrically conductive material of the electrode/via/line. (See, for example, U.S. Pat. No. 8,686,484). Indeed, the one or more second dielectric layers of the embodiment of FIG. 1B, may provide, among other things, an additional barrier between the free magnetic region and the electrically conductive material of, for example, the electrode/via/line.

Figure 1B:
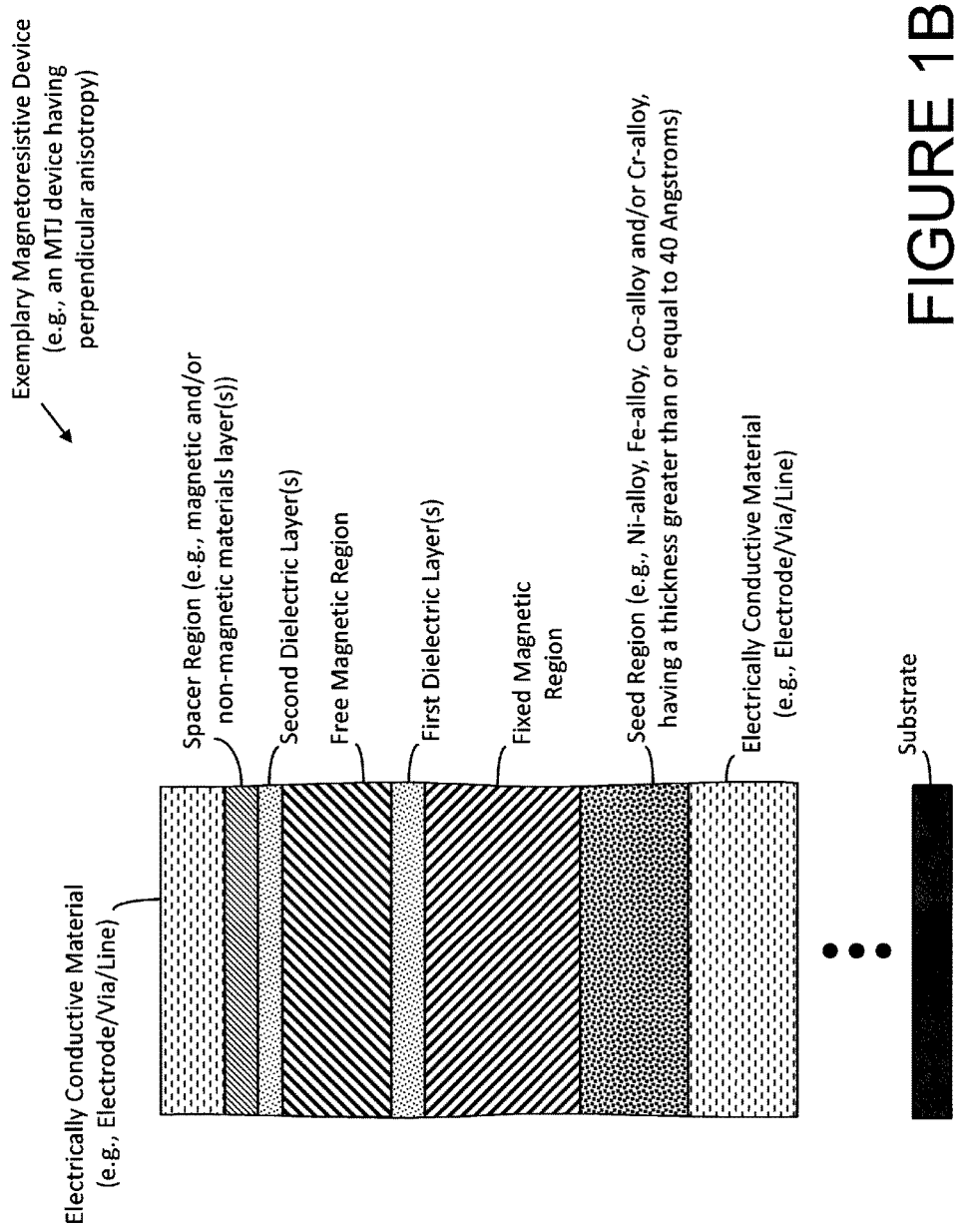
Figure 2A:
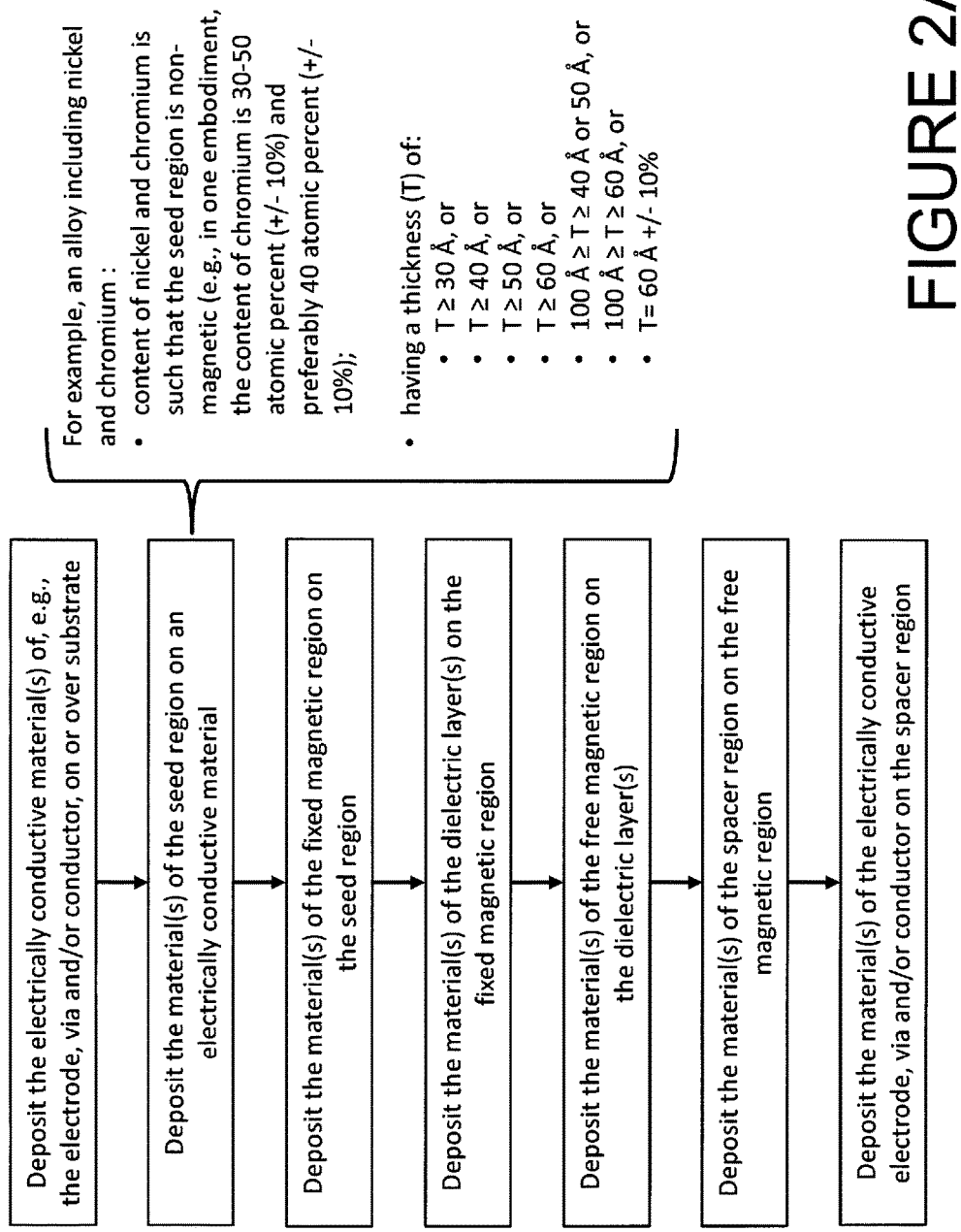
FIGS. 2A and 2B are simplified exemplary manufacturing flows for the deposition of layers of the exemplary MTJ-type magnetoresistive stack/structures of FIGS. 1A and 1B, respectively, according to certain aspects of certain embodiments of the present inventions wherein the various layers and/or regions are sequentially deposited, grown, sputtered, evaporated, formed and/or provided (hereinafter collectively "deposited" or other verb tense (e.g., "deposit" or "depositing")) to provide the material stack that, after further processing, will be an MTJ-type magnetoresistive stack/structure (for example, having a perpendicular magnetic anisotropy)
Figure 2B:
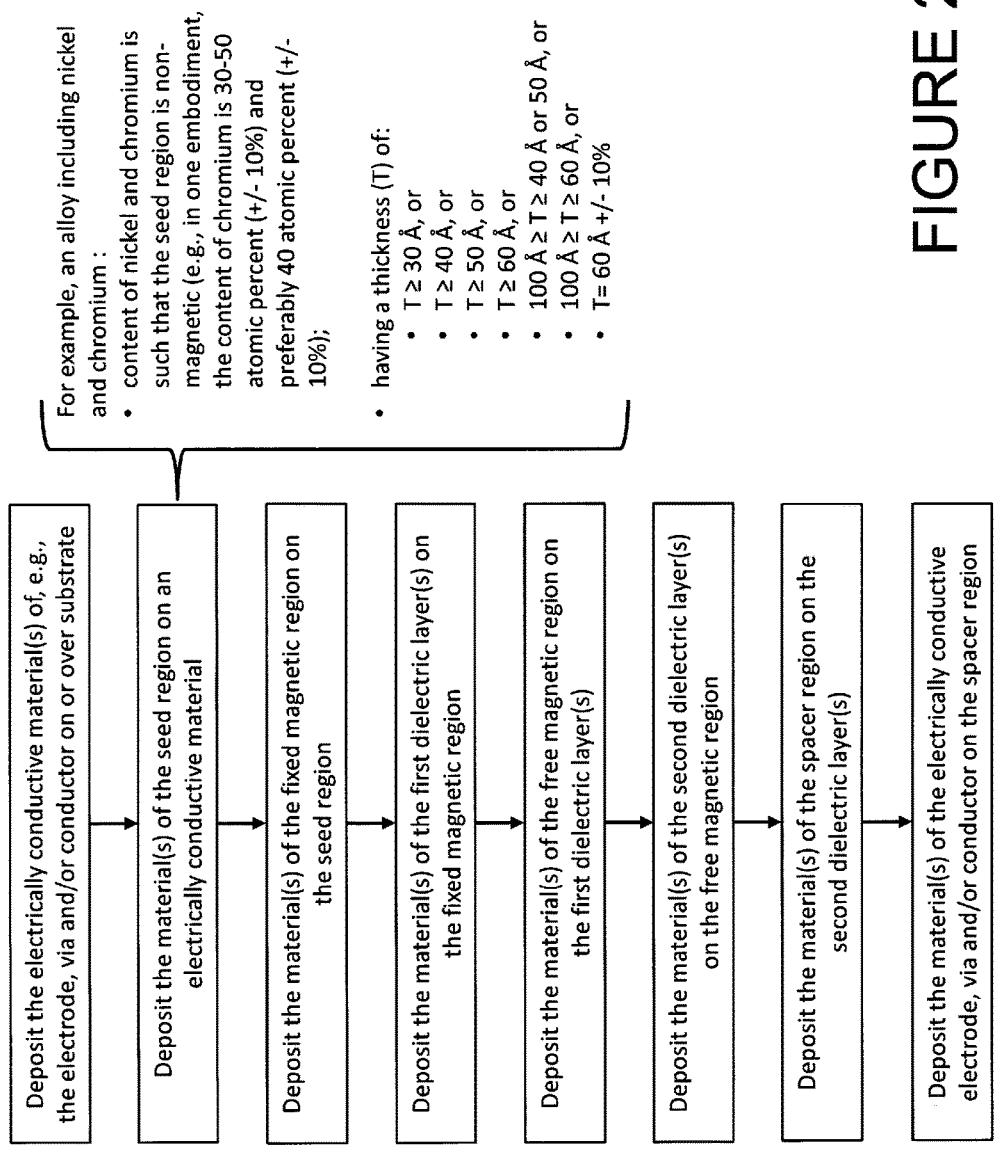

Notably, the magnetoresistive stack/structure may be fabricated from the layers and/or regions of FIGS. 1A and 1B using any process technique now known or later developed, for example, using well known conventional deposition and lithographic techniques to form the magnetoresistive stack/structure from the layers and/or regions of FIGS. 1A and 1B. In one embodiment, the present inventions employ the process techniques described and/or illustrated in Provisional Patent Application Nos. 62/111,976 and 62/249,196, which are incorporated herein by reference in their entirety; notably, all of the inventions/embodiments described and/or illustrated herein may be implemented or employed in conjunction with the inventions/embodiments of the '976 and '196 applications.

During processing, the magnetoresistive stack/structure including the seed region of the present inventions maintains or includes, notwithstanding subsequent or additional processing (for example, annealing processes having temperatures of 400° C.), improved properties (for example, magnetoresistance (MR) and resistance-area product (RA) of the stack/structure). For example, a MTJ stacks/structure, having a perpendicular magnetic anisotropy, maintains or includes improved properties or characteristics (for example, magnetoresistance (MR) and resistance-area product (RA) of the stack/structure) after processing (for example, one or more annealing processes after deposition/formation of the magnetic region). Indeed, a magnetoresistive stack/structure including such a seed region may be more reliable and thermally stable (relative to conventional seed regions) and/or provide greater thermal endurance notwithstanding subsequent or additional processing (for example, annealing processes having temperatures of 400° C.).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Many modifications, variations, combinations and/or permutations are possible in light of the above teaching. For example, although certain exemplary techniques are described and/or illustrated above in the context of MTJ-based magnetoresistive stacks/structures, as noted above, the present inventions may be implemented in GMR-based magnetoresistive stacks/structures (for example, sensor and memory). For the sake of brevity such discussions/illustrations will not be repeated in the context of GMR-based magnetoresistive stacks/structures having seed region of the present inventions—but it is to be interpreted as entirely applicable to GMR-based stacks/structures where a conductor (rather than a dielectric material in the case of MTJ-based stacks/structures) is disposed between magnetic materials.

Further, in one exemplary embodiment, the free magnetic region includes a plurality of ferromagnetic materials and/or layers (for example, including materials such as cobalt, iron, boron, nickel and/or one or more alloys thereof such as a cobalt-iron alloy or a cobalt-iron-boron alloy) but does not include a plurality of insertion layers in an alternating ferromagnetic layer—insertion layer structure. (See, FIG. 4B). Albeit, in another embodiment, one or more insertion layers are included and not omitted from the free magnetic region. Moreover, the free magnetic region may omit one or both of the ferromagnetic interface regions (for example, for example, iron or an iron alloy) which interface with and/or contact the dielectric layer (i.e., tunnel barrier of the magnetoresistive stack/structure) and the spacer region (see FIG. 1A) or the first and second dielectric layers (see FIG. 1B).

Figure 6A:
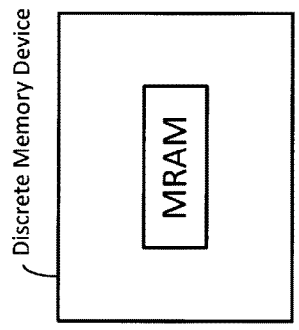
FIGS. 6A and 6B are schematic block diagrams of integrated circuits including discrete memory device and an embedded memory device, each including MRAM (which, in one embodiment is representative of one or more arrays of MRAM having a plurality of magnetoresistive memory stacks/structures according to according to certain aspects of certain embodiments of the present inventions.
Figure 6B:
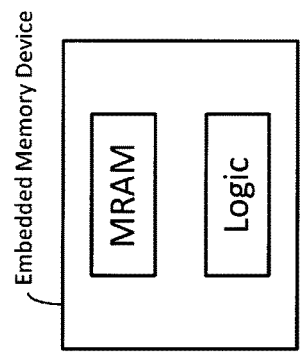
Figure 5:
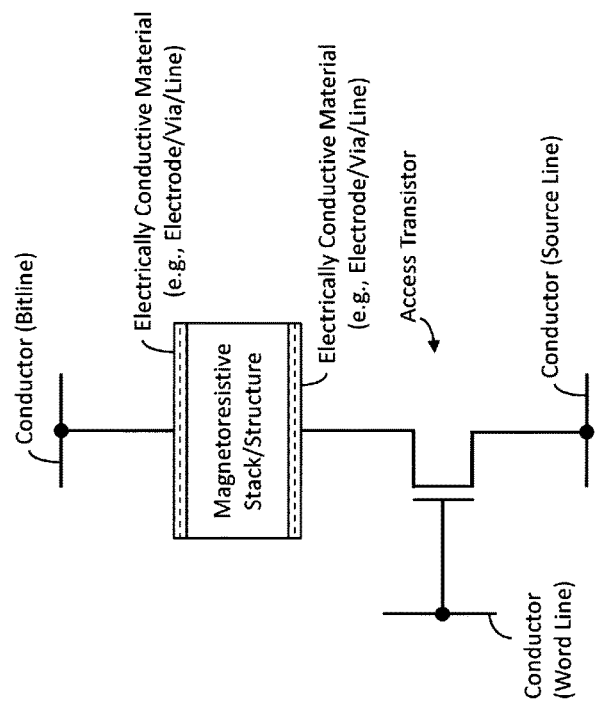
FIG. 5 is an exemplary schematic diagram of a magnetoresistive memory stack/structure electrically connected to an access transistor in a magnetoresistive memory cell configuration.

In addition, the magnetoresistive stack/structure of the present inventions may be implemented in a sensor architecture or a memory architecture (among other architectures). For example, in a memory configuration, the magnetoresistive memory stack/structure may be electrically connected to an access transistor and configured to coupled or connect to various conductors (which carry one or more control signals). (See, FIG. 5). In one embodiment, a plurality of magnetoresistive memory stacks/structures may be fabricated and/or incorporated on an integrated circuit, for example, in an MRAM array. (See, FIGS. 6A and 6B).

The alloys described and illustrated herein may be formed using any technique now known or later developed. For example, the alloys may be formed via co-deposition (for example, via sputtering and/or evaporating of a nickel-chrome alloy or via concurrently and separately sputtering and/or evaporating nickel and chromium). In addition thereto, or in lieu thereof, sequentially depositing materials, together with one or more annealing processes, may be employed to form the alloys. Again, any technique now known or later developed may be used to form the alloys described and illustrated herein.

The fixed, unpinned SAF region may include two multi-layer structures (AP1 and AP2—for example, like that of the magnetic multi-layer structure of FIG. 3A). In another embodiment, the fixed, unpinned SAF region may include only one multi-layer structure (either AP2 or AP1) and a non-multi-layer structure (the other of AP2 or AP1). Here, the magnetic multi-layer structure and a non-multi-layer structure are antiferromagnetically coupled via a coupling layer. The multi-layer structure (AP1 or AP2) may include any particular structure or architecture (and be manufactured) consistent with any of the embodiment described and/or illustrated herein.

Further, as mentioned above, in one embodiment, the fixed magnetic region includes multi-layer structures (AP1 or AP2) and a transition layer and reference layer disposed between AP2 and the dielectric layer. (See, FIG. 3C). Here, the transition layer, may include one or more types of material that facilitate/improve growth of the dielectric layer (which is a tunnel barrier in the MTJ structure) during fabrication. In one embodiment, the reference layer may include one or more or all of cobalt, iron, boron and tantalum (for example, in an alloy—such as an amorphous alloy (e.g., CoFeB or CoFeBTa or CoFeTa) and the transition layer may include a non-ferromagnetic transition metal such as tantalum, titanium, tungsten and/or molybdenum. Moreover, in another embodiment, the reference layer may include a layer of iron (for example, deposited as pure or substantially pure iron) and a layer of (i) cobalt and iron or (ii) cobalt, iron and boron (for example, deposited as an alloy) wherein, after further/final processing (e.g., after annealing), the layer of iron at the interface may form a continuous atomic layer or may mix with the underlying ferromagnetic alloy in the final annealed structure, resulting in a high-iron alloy interface region (for example, greater than or equal to 50% iron by atomic percentage) within the reference layer which is adjacent to the dielectric layer.

Notably, while the magnetic materials layer(s) and magnetic materials of the MTJ stack/structure are illustrated as a single layer, the magnetic materials layer(s) and magnetic materials may include a number of different layers of both magnetic and nonmagnetic material. For example, the layers may include multiple layers of magnetic material, dielectric layers that provide, for example, one or more diffusion barriers, coupling layers between layers of magnetic material that provide for ferromagnetic or antiferromagnetic coupling, antiferromagnetic material. For example, one of the magnetic material layer(s) may include a set of layers forming a SAF and a layer of antiferromagnetic material, seeding layers, diffusion layers as well as non-contiguous layers of magnetic and nonmagnetic material. The other magnetic material layer(s) may include a set of layers corresponding to a SyF, seeding layers, spacing layers, diffusion layers as well as non-contiguous layers of magnetic and nonmagnetic material. Notably, each of the layers shown to be included in the magnetoresistive device may be a composite layer that includes multiple sub-layers. Other embodiments may include multiple SAFs, SyFs, and tunnel barriers in addition to the other layers, where the materials and structures are arranged in various combinations and permutations now known or later developed.

For example, one or more regions (for example, the fixed magnetic region) of the magnetoresistive stack/structure (for example, a magnetoresistive memory stack/structure or a magnetoresistive sensor/transducer stack/structure) may include and/or consist of a SyF. For example, the fixed magnetic region may be a pinned or unpinned SyF including, for example, a multi-layer SyF a plurality of layers of one or more magnetic or ferromagnetic materials separated by an ferromagnetic coupling layer (for example, an coupling layer including ruthenium or rhodium having a thickness that provides ferromagnetic coupling). Such a SyF may be deposited or formed on the seed region. Notably, all of the inventions described and/or illustrated herein may be implemented in conjunction with a pinned or unpinned SyF embodiment; however, for the sake of brevity, such combinations and permutations will not be described/illustrated separately herein.

Further, the one or more layers of magnetic materials (for example, nickel, iron, cobalt, and alloys thereof) may be etched, formed and/or patterned using any etchants and/or technique now known or later developed—for example, using mechanical and/or chemical techniques (for example, an ion beam etching, low bias power sputter technique or a chemical etch technique (such as a conventional fluorine and/or chlorine based etch technique)). Where the magnetic material stack includes one or more SAFs or SyFs, the one or more layers of magnetic materials layers may also include one or more non-magnetic materials layers (for example, copper, aluminum or non-ferromagnetic transition metals, such as tantalum, niobium, vanadium, zirconium, molybdenum or ruthenium). Notably, one or more magnetic material stack may include SAF and SyF structures, one or more layers of magnetic materials, and other materials (including magnetic and/or non-magnetic) now known or later developed. Such materials and/or structures may be arranged in any combination or permutation now known or later developed.

The MTJ-based magnetoresistive stack/structure may include out-of-plane magnetic anisotropy or in-plane magnetic anisotropy. The present inventions are applicable to all forms or types of magnetoresistive stacks/structures. Moreover, the free magnetic region may be disposed on the magnetic tunnel barrier or beneath the magnetic tunnel barrier; the fixed magnetic region would be disposed on and interface a side of the magnetic tunnel barrier which is opposite to the side that interfaces the free magnetic region.

Further, although the exemplary embodiments are described and/or illustrated above in the context of MTJ stacks/structures having a free magnetic region disposed above the tunnel barrier and the fixed magnetic region disposed below the tunnel barrier, the present inventions may be implemented wherein the fixed magnetic region is disposed above the tunnel barrier and the free magnetic region disposed below the tunnel barrier. In this embodiment, the free magnetic region is formed on (and in contact with) the seed region. For the sake of brevity, the embodiment where the free magnetic region is formed on and in contact with the seed region will not be separately illustrated—but these inventions are to be interpreted as entirely applicable to such embodiments where the free magnetic region is formed and disposed on the seed region (rather than formed and disposed on a dielectric material in the case of MTJ stacks/structures). As such, in one embodiment, the magnetoresistive stack/structure includes an out-of-plane magnetic anisotropy (for example, perpendicular magnetic anisotropy) where a pinned or unpinned fixed magnetic region is disposed on or above one or more layer(s) of dielectric material, which is disposed on or above a free magnetic region wherein the free magnetic region is disposed on and in contact with the seed region (which may be disposed on and in contact with one or more layers of electrically conductive materials.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions so that those skilled in the art should understand that they can make various changes, substitutions and alterations without departing from the spirit and scope of the inventions in their broadest form.

Notably, reference herein to "one embodiment" or "an embodiment" means that a particular feature, structure, or characteristic described in connection with the embodiment may be included, employed and/or incorporated in one, some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as indicated above, an embodiment or implementation described herein as "exemplary" is not to be construed as preferred or advantageous, for example, over other embodiments or implementations; rather, it is intended convey or indicate the embodiment or embodiments are example embodiment(s).

In the claims, the term "ferromagnetic material" means or includes magnetic and/or ferromagnetic materials. As noted above, the term "deposit" (or various forms thereof (e.g., deposited, deposition or depositing)) means or includes deposit, grow, sputter, evaporate, form and/or provide (or various forms thereof). Moreover, in the claims, values, limits and/or ranges of the thickness and atomic composition of, for example, the seed region, means the value, limit and/or range +/−10%. The term "magnetoresistive stack", in the claims, means or includes a magnetoresistive stack or magnetoresistive structure, for example, a magnetoresistive memory stack/structure (such as a memory cell in, for example, MRAM or the like) or a magnetoresistive sensor/transducer stack/structure (such as, for example, a read head for hard disk drives or the like).

The terms "comprise," "include," "have" and any variations thereof (for example, "comprising," "including" and "having") are used synonymously to denote or describe non-exclusive inclusion. As such, a process, method, article and/or apparatus that uses such terms to, for example, describe a recipe, configuration and/or contents, does not include only those steps, structures and/or elements but may include other steps, structures and/or elements not expressly identified, listed or inherent to such process, method, article or apparatus.

Further, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

What is claimed is:

1. A method of manufacturing a magnetoresistive stack comprising:
    depositing a seed region on an electrically conductive material, wherein depositing the seed region includes:
        depositing an alloy including nickel and chromium having a thickness greater than or equal to 40 Angstroms and a material composition of chromium in the range of 25-60% by atomic percent;
    depositing a fixed magnetic region on and in direct contact with the seed region, wherein depositing the fixed magnetic region includes:
        depositing a multilayer unpinned, fixed synthetic antiferromagnetic structure including (i) depositing a first ferromagnetic structure on and in direct contact with the seed region, (ii) depositing a coupling material on and in direct contact with the first ferromagnetic structure, and (iii) depositing a second ferromagnetic structure on and in direct contact with the coupling material,
        depositing a transition layer on and in direct contact with the second ferromagnetic structure, wherein the transition layer includes a non-ferromagnetic transition metal, and
        forming a high-iron alloy interface region over the transition layer, wherein the high-iron alloy interface region has at least 50% iron by atomic composition;
    depositing one or more dielectric layers wherein, after annealing, the one or more dielectric layers are on and in direct contact with the high-iron alloy interface region of the fixed magnetic region; and depositing a free magnetic region over the one or more dielectric layers.

2. The method of claim 1 wherein depositing the alloy including nickel and chromium of the seed region includes depositing an alloy including nickel and chromium having:
a thickness greater than or equal to 50 Angstroms and less than or equal to 100 Angstroms, and
a material composition of chromium in the range of 30-50% by atomic percent.

3. The method of claim 1 wherein depositing the first ferromagnetic structure of the multilayer unpinned, fixed synthetic antiferromagnetic structure of the fixed magnetic region includes depositing a plurality of layers of at least two of cobalt, nickel and platinum.

4. The method of claim 1 wherein depositing the first ferromagnetic structure of the multilayer unpinned, fixed synthetic antiferromagnetic structure of the fixed magnetic region on and in direct contact with the seed region includes depositing alternating layers of nickel and cobalt including a layer of nickel on and in direct contact with the seed region.

5. The method of claim 1 wherein depositing the first ferromagnetic structure of the multilayer unpinned, fixed synthetic antiferromagnetic structure of the fixed magnetic region on and in direct contact with the seed region includes depositing alternating layers of cobalt and platinum including a layer of cobalt on and in direct contact with the seed region.

6. The method of claim 1 wherein depositing the alloy including nickel and chromium of the seed region includes depositing an alloy including nickel and chromium having a thickness greater than or equal to 60 Angstroms.

7. The method of claim 1 wherein depositing the alloy including nickel and chromium of the seed region includes depositing an alloy including nickel and chromium having a thickness greater than or equal to 50 Angstroms and less than or equal to 100 Angstroms.

8. The method of claim 1 wherein depositing the alloy including nickel and chromium of the seed region includes depositing an alloy including nickel and chromium having a material composition of chromium in the range of 30-50% by atomic percent.

9. The method of claim 1 wherein depositing the coupling material includes depositing ruthenium having of thickness of 4 Angstroms.

10. A magnetoresistive stack comprising:
a seed region disposed on an electrically conductive material, wherein the seed region includes an alloy including nickel and chromium having a thickness greater than or equal to 40 Angstroms and a material composition of chromium in the range of 25-60% by atomic percent;
a fixed magnetic region disposed on and in direct contact with the seed region, wherein the fixed magnetic region includes a multilayer unpinned, fixed synthetic antiferromagnetic structure including:
a first ferromagnetic structure on and in direct contact with the seed region,
a coupling layer on and in direct contact with the first ferromagnetic structure, and
a second ferromagnetic structure on and in direct contact with the coupling layer;
a transition layer on and in direct contact with the second ferromagnetic structure, wherein the transition layer includes a non-ferromagnetic transition metal, and
a high-iron alloy interface region disposed over the transition layer, wherein the high-iron alloy interface region includes at least 50% iron by atomic composition;
one or more dielectric layers disposed on and in direct contact with the high-iron alloy interface region of the fixed magnetic region; and
a free magnetic region disposed over the one or more dielectric layers.

11. The magnetoresistive stack of claim 10 wherein the first ferromagnetic structure of the multilayer unpinned, fixed synthetic antiferromagnetic structure of the fixed magnetic region includes a plurality of layers of magnetic material including at least two of cobalt, nickel and platinum.

12. The magnetoresistive stack of claim 10 wherein the first ferromagnetic structure of the multilayer unpinned, fixed synthetic antiferromagnetic structure of the fixed magnetic region includes alternating layers of nickel and cobalt including a first layer of nickel disposed on and in direct contact with the seed region.

13. The magnetoresistive stack of claim 10 wherein the first ferromagnetic structure of the multilayer unpinned, fixed synthetic antiferromagnetic structure of the fixed magnetic region includes alternating layers of platinum and cobalt including a first layer of cobalt disposed on and in direct contact with the seed region.

14. The magnetoresistive stack of claim 10 wherein the alloy including nickel and chromium of the seed region includes an alloy of nickel and chromium having a thickness greater than or equal to 60 Angstroms.

15. The magnetoresistive stack of claim 10 wherein the alloy including nickel and chromium of the seed region includes an alloy of nickel and chromium having a thickness greater than or equal to 50 Angstroms and less than or equal to 100 Angstroms.

16. The magnetoresistive stack of claim 15 wherein the alloy including nickel and chromium of the seed region includes nickel and chromium having a material composition of chromium in the range of 30-50% by atomic percent.

17. The magnetoresistive stack of claim 10 wherein the coupling material is ruthenium having of thickness of 4 Angstroms.

18. A magnetoresistive stack comprising:
an electrically conductive material disposed over a substrate;
a seed region disposed on and in direct contact with the electrically conductive material, wherein the seed region is an alloy including nickel and chromium having:
a thickness that is greater than or equal to 40 Angstroms and less than or equal to 100 Angstroms, and
a material composition of chromium in the range of 30-50% by atomic percent;
a fixed magnetic region disposed on and in direct contact with the seed region, wherein the fixed magnetic region includes:
an unpinned, fixed synthetic antiferromagnetic structure including:
a first plurality of ferromagnetic layers including a first ferromagnetic layer which is disposed on and in direct contact with the seed region,
a coupling layer disposed on and in direct contact with a ferromagnetic layer of the first plurality of ferromagnetic layers, and
a second plurality of ferromagnetic layers over the coupling layer;

a transition layer on and in direct contact with the second ferromagnetic structure, wherein the transition layer includes a non-ferromagnetic transition metal, and a high-iron alloy interface region disposed over the transition layer, wherein the high-iron alloy interface region includes at least 50% iron by atomic composition;

one or more dielectric layers disposed on and in direct contact with the high-iron alloy interface region of the fixed magnetic region; and a free magnetic region disposed over the one or more dielectric layers.

19. The magnetoresistive stack of claim 18 wherein:
the first plurality of ferromagnetic layers includes alternating layers of cobalt and platinum, and
the first ferromagnetic layer of the first plurality of ferromagnetic layers is cobalt.

20. The magnetoresistive stack of claim 18 wherein:
the first plurality of ferromagnetic layers includes alternating layers of cobalt and nickel, and
the first ferromagnetic layer of the first plurality of ferromagnetic layers is nickel.

21. The magnetoresistive stack of claim 18 wherein the electrically conductive material includes tantalum.

22. The magnetoresistive stack of claim 18 wherein the alloy including nickel and chromium of the seed region includes a thickness of 60 Angstroms and a material composition of chromium of 40% by atomic percent.

23. The magnetoresistive stack of claim 18 wherein the coupling material is ruthenium having of thickness of 4 Angstroms.

24. The magnetoresistive stack of claim 18 wherein the non-ferromagnetic transition metal is titanium, tungsten and/or molybdenum.

25. The magnetoresistive stack of claim 18 wherein the electrically conductive material is a tantalum-nitride alloy composite.

26. The method of claim 1 wherein the non-ferromagnetic transition metal is titanium, tungsten and/or molybdenum.

27. The method of claim 1 further including depositing the electrically conductive material wherein the electrically conductive material is a tantalum-nitride alloy composite.

28. The magnetoresistive stack of claim 10 wherein the non-ferromagnetic transition metal is titanium, tungsten and/or molybdenum.

29. The magnetoresistive stack of claim 10 wherein the electrically conductive material is a tantalum-nitride alloy composite.

* * * * *